(12) United States Patent
Barrera et al.

(10) Patent No.: US 8,302,884 B1
(45) Date of Patent: Nov. 6, 2012

(54) APPARATUS AND METHOD OF EFFECTIVE FLUID INJECTION AND VAPORIZATION FOR CHEMICAL VAPOR DEPOSITION APPLICATION

(75) Inventors: Martin M. Barrera, Santa Clara, CA (US); Alex E. Spencer, Pleasanton, CA (US)

(73) Assignee: Novellus Systems, Inc., San Jose, CA (US)

( * ) Notice: Subject to any disclaimer, the term of this patent is extended or adjusted under 35 U.S.C. 154(b) by 2679 days.

(21) Appl. No.: 09/675,860

(22) Filed: Sep. 29, 2000

(51) Int. Cl.
*B05B 7/30* (2006.01)
(52) U.S. Cl. ......... 239/318; 239/422; 239/426; 239/434
(58) Field of Classification Search .................. 239/310, 239/318, 418, 422, 426, 433, 434
See application file for complete search history.

(56) References Cited

U.S. PATENT DOCUMENTS

| | | | | |
|---|---|---|---|---|
| 2,507,410 A | * | 5/1950 | Kemp | 137/599.12 |
| 2,592,884 A | * | 4/1952 | Fox et al. | 134/58 D |
| 3,132,806 A | * | 5/1964 | McNair et al. | 215/11.1 |
| 3,303,800 A | * | 2/1967 | Young | 111/7.1 |
| 4,060,355 A | * | 11/1977 | Walz et al. | 239/DIG. 7 |
| 4,255,938 A | * | 3/1981 | Norris et al. | 137/15.2 |
| 4,397,422 A | * | 8/1983 | Gwyn | 222/136 |
| 4,564,375 A | * | 1/1986 | Munk et al. | 239/589.1 |
| 5,150,601 A | | 9/1992 | Simeroth et al. | |
| 5,346,133 A | | 9/1994 | Bogner et al. | |
| 5,456,023 A | * | 10/1995 | Farnan | 34/270 |
| 5,501,397 A | * | 3/1996 | Holt | 239/124 |
| 5,527,567 A | | 6/1996 | Desu et al. | |
| 5,968,594 A | | 10/1999 | Hu et al. | |

* cited by examiner

Primary Examiner — Christopher Kim

(57) ABSTRACT

A cross-flow injector is used to introduce fluids into a chemical vapor deposition process chamber separately and simultaneously for efficiently atomizing and vaporizing the fluids. The cross-flow injector consists of a three port cavity having an inlet nozzle, a throat region, and an exit nozzle. The injector cavity is defined by the tapering of the inlet and exit nozzles to the smaller diameter of the throat region. The tapering allows for pressure differentials at the inlet, throat, and exit regions, and assures the inlet pressure being much greater than the exit region. The throat region consists of additional apertures for injecting dopants and precursors within the fluid flow. The pressure differential at the throat region atomizes and vaporizes the injected dopant and precursor fluids. In a second embodiment, the injector cavity consists of two ports, having an inlet nozzle and a throat region. The inlet nozzle is tapered to meet the smaller diameter of the throat region, and the throat region extends to and becomes the exit nozzle portion so that the exit nozzle portion maintains the same diameter as the throat region.

24 Claims, 6 Drawing Sheets

Detail A

APPARATUS AND METHOD OF EFFECTIVE FLUID INJECTION AND VAPORIZATION FOR CHEMICAL VAPOR DEPOSITION APPLICATION

BACKGROUND OF THE INVENTION

1. Field of the Invention

This invention relates to chemical vapor deposition of thin films. Particularly, this invention relates to an apparatus and method for liquid injection and vaporization within a chemical vapor deposition process.

2. Description of Related Art

In a chemical vapor deposition (CVD) process, species in the vapor phase are injected over a substrate (or wafer) and react to form a deposit on the substrate. Often, this is done with plasma enhancement (PECVD). This technique provides for superior coverage of complex topographies on the substrate surface. The introduction of deposition reactants and other dopants has posed technical problems in the art that are governed, in part, by the physical properties these materials undergo within the chemical vapor deposition process. Some resolutions to these problems have incorporated direct injection of liquid solutions to introduce a deposition reactant into a CVD deposition chamber. Other answers have considered vaporizing pre-mixed solutions upon injection into the chamber. Typically, a solution is pre-mixed and produced outside the deposition chamber and transported to the chamber under temperature and pressure conditions appropriate for maintaining the solution in a liquid state until injection. Once injected, the solution then vaporizes for efficient mixing within the chamber and subsequent deposition. For the purposes of this disclosure, the term "solution" refers to any multi-component homogeneous single-phase liquid, regardless of the relative concentrations or states of aggregation, complexing, or bonding of the components in the liquid. The injected solution is applied within the chamber typically by an injection nozzle, where, under proper temperature and pressure conditions, the solution is allowed to enter the vapor phase over the substrate, react, and deposit a film.

In U.S. Pat. No. 5,527,567 issued to Desu, et al., on 18 Jun. 1996, entitled, "METALORGANIC CHEMICAL VAPOR DEPOSITION OF LAYERED STRUCTURE OXIDES," a chemical vapor deposition process is taught in which the vapors are introduced into the reactor either through a set of bubblers or through a direct liquid injection system. A flash vaporization chamber (basically a pump with a liquid flow meter) is employed along with a needle valve inserted within the flow line to control the flow of liquid. A preheated carrier gas is used to transport the pre-mixed vaporized source from the vaporization chamber.

In U.S. Pat. No. 5,968,594 issued to Hu et al., on 19 Oct. 1999, entitled "DIRECT LIQUID INJECTION OF LIQUID AMMONIA SOLUTIONS IN CHEMICAL VAPOR DEPOSITION," reactants are delivered by direct liquid injection. The reactant solution is produced outside the deposition chamber and transported to the chamber under temperature and pressure conditions appropriate for maintaining the solution in a liquid state until injection. The liquid solution serves as a vehicle to transport reactant material to the deposition chamber.

The present methods in the art used to inject a carrier fluid (gas) such as tetraethylorthosilicate (TEOS) along with precursors and dopants into the gas manifolding leading to the reactor chamber is inefficient and does not fully vaporize the injected fluids, especially the TEOS. In addition, the heat supplied to the gas manifold necessary to heat the carrier fluid is optimized to heat a liquid which has been fully atomized. When using TEOS as a carrier fluid, if the fluids do not atomize upon entering the gas manifold, the heat transfer of the fluids is then limited by the large droplets of TEOS on the manifold structure. The result is a mixing bowl which fills with TEOS liquid and inefficient deposition of silicon oxide on the process wafers with the potential risk of carrier gas material landing on the wafer. Although TEOS is described as an illustrative example, other fluids commonly used in the art will have similar constraints.

In addition to the inefficient atomization of the liquid(s) entering the process chamber, flow rate control presents another concern. The flow rates required for TEOS are typically in the range of 0-6 ml/min. The flow rates for the dopants used in the TEOS processes are in the range of 0-1 ml/min. Presently, the methods used to introduce these low flow rates of dopants and TEOS into the chamber require pre-mixing of the liquids. Once these liquids are pre-mixed, they are passed through a high pressure drop capillary tube which drops the pressure of the liquids to the low pressure levels required for vaporization and introduction within the process chamber. This high pressure drop capillary tube also prevents cavitation from occurring in the liquid supply lines. One difficulty with using capillary tubes, however, is the inherent limitations on pressure drops. The pressure drop in a capillary tube is inversely proportional to its length, and proportional to the fourth power of the diameter of the tube ($D^4/L$). As a result, depending upon the flow rate required, either the pressure drop across the capillary tube will be excessive or the capillary tube will need to be extremely long to meet the flow rate required for the specific process. Moreover, capillary injector tubes are generally sophisticated in their configuration, and difficult to manufacture and service.

As a result of pre-mixing liquids prior to their introduction into the chamber, minor pressure fluctuations in any of the multiple liquid flow supplies will cause the dopant flow rate to fluctuate. Since the dopant flow levels are much lower than the TEOS flow rates, minor changes in the TEOS flow will cause large changes in the dopant flow. This phenomena is sometimes referred to as "crosstalk." Additionally, high pressures are typically required to drive the liquids through the restrictive capillary tubes. As a result, a delay of tens of seconds is required in order for the dopant to stabilize. Furthermore, the explosive nature of certain fluids, such as TEOS, requires the introduction of these fluids under safe temperature and pressure conditions.

Bearing in mind the problems and deficiencies of the prior art, it is therefore an object of the present invention to provide an apparatus and method to atomize and vaporize precursors and dopants in a chemical vapor deposition process more thoroughly and efficiently.

It is another object of the present invention to provide an apparatus and method which allows for the separate introduction of different liquids with widely different flow rates, including low flow rate dopant liquids, into a CVD process chamber at constant pressure.

A further object of the invention is to provide an apparatus and method for effective atomization and vaporization of any liquid precursor prior to its introduction into a reactive chamber.

It is yet another object of the present invention to provide an apparatus and method to introduce liquids into a chemical vapor deposition chamber in a constant pressure environment without pre-mixing the liquids.

Another object of the present invention is to provide an apparatus and method which prevents TEOS or other liquids which are explosive in the presence of oxygen at high pressure and temperature from reaching their auto-ignition point.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an apparatus for delivering a plurality of fluids to a chemical vapor deposition chamber, having a cavity comprising: an inlet nozzle having a first diameter to receive one of the plurality of fluids as a carrier fluid, and configured to maintain a first pressure and a first temperature; a throat region having a first and second end, connecting to the inlet nozzle at the first end, having a second diameter less than the first diameter, and configured to maintain a second pressure and second temperature; the throat region having at least one aperture adjacent to the first and second ends to allow for the introduction of at least one of the plurality of fluids to the carrier fluid; and, an exit nozzle, connect to the throat region at the second end, having a third diameter greater than the second diameter, and configured to maintain a third pressure and third temperature. The inlet nozzle is configured to have the first diameter taper down to the throat region second diameter at an angle in the range of forty to sixty degrees. The throat region is configured to operate at a critical Mach number of 1.0. The second pressure and the second temperature are selected to present a condition for atomization of the fluids. Some of the plurality of fluids are intended as precursors, and others of the plurality of fluids are dopants.

The throat region further comprises two or more apertures adjacent to the first and second ends to allow for the introduction of two or more of the plurality of fluids to the carrier fluid, each of the two or more of the plurality of fluids introduced separately through individual apertures. The plurality of fluids are introduced separately and simultaneously without pre-mixing.

In a second aspect, the present invention is directed to an apparatus for delivering a plurality of fluids to a chemical vapor deposition chamber, having a cavity comprising: an inlet nozzle having a first diameter to receive one of the plurality of fluids as a carrier fluid, and configured to maintain a first pressure and a first temperature; a throat region having a first and second end, connecting to the inlet nozzle at the first end, having a second diameter less than the first diameter, and configured to maintain a second pressure and second temperature; the throat region having at least one aperture adjacent to the first and second ends to allow for the introduction of at least one of the plurality of fluids to the carrier fluid; and, an exit nozzle, connect to the throat region at the second end, having the second diameter, and configured to maintain the second pressure and the second temperature, such that the exit nozzle is an extension of the throat region having the same dimensions as the throat region.

In a third aspect, the present invention is directed to a method for introducing a plurality of fluids into a chemical vapor deposition process chamber comprising: injecting at least one of the plurality of fluids as a carrier fluid in line at a constant flow rate and under conditions of a first pressure and first temperature; injecting others of the plurality of fluids separately, simultaneously, and without pre-mixing, as precursors and dopants in line with the carrier fluid and under conditions of a second pressure and a second temperature; and, exiting the fluids to the chamber such that the fluids undergo atomization and vaporization.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
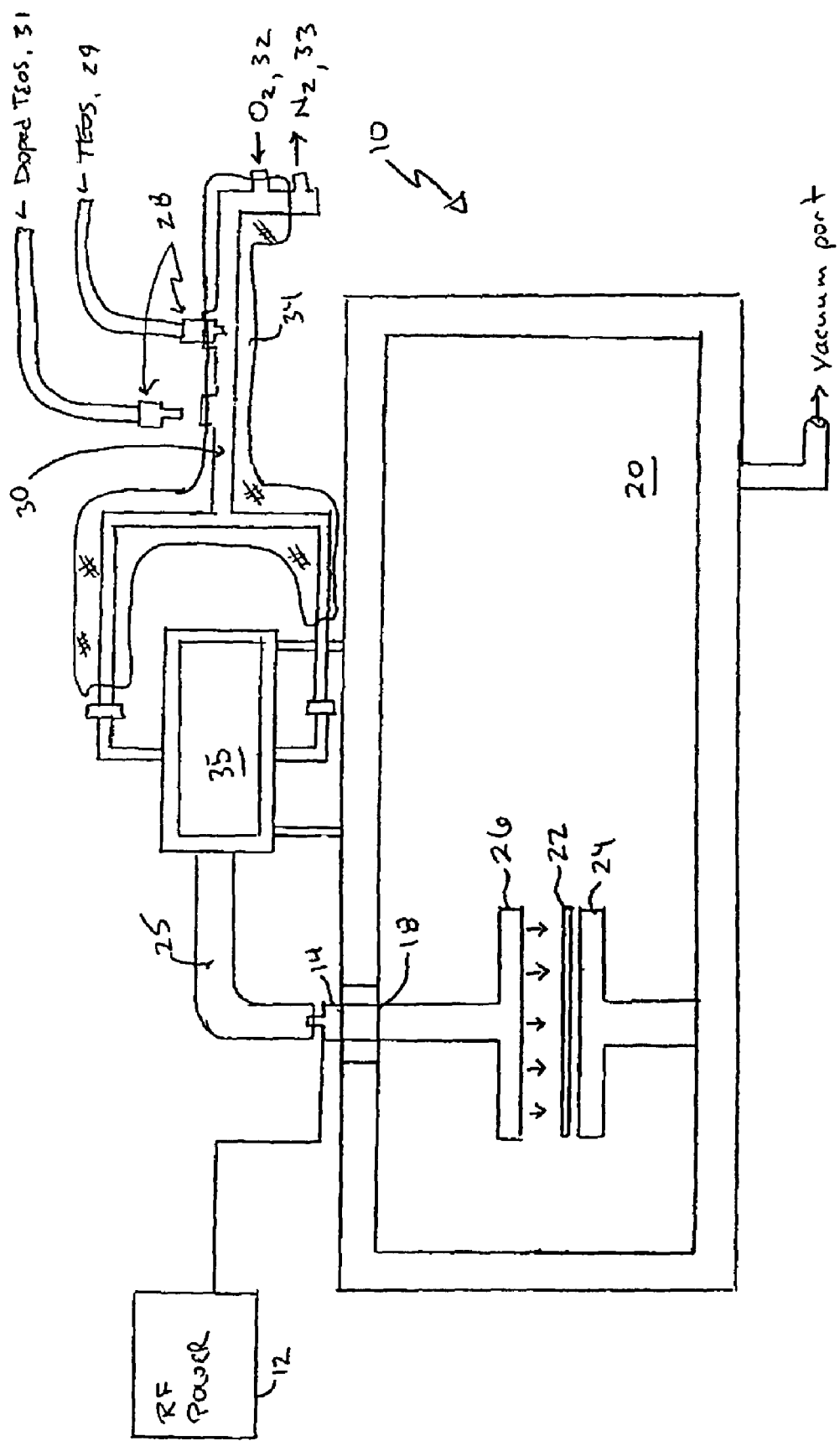
FIG. 1 is a prior art schematic of a plasma enhanced chemical vapor deposition system.

In describing the preferred embodiment of the present invention, reference will be made herein to FIGS. 1-6 of the drawings in which like numerals refer to like features of the invention. Features of the invention are not necessarily shown to scale in the drawings.

FIG. 1 is a schematic representation of a prior art remote plasma enhanced CVD chamber 10. Typically, these remote PECVD chambers provide for RF power 12 to be supplied by a tube 14, to inductively excite a gas delivered at the top of reactor 10. The gas excitation occurs between the heated pedestal 24 and the showerhead 26. The gas disperses within chamber 20 via showerhead 26 and reacts with substrate 22 which is supported on a heated pedestal 24. The pedestal 24 is typically heated at a constant temperature, preferably 350° C., using embedded heater elements (not shown).

A capillary injector 28 is used to inject TEOS 29 or doped TEOS 31 into a heated injector manifold (HIM) 30. The TEOS is vaporized in the HIM 30 after being mixed with oxygen 32 and/or nitrogen 33. A heater blanket 34 is typically used to insulate the HIM 30. The deposition of silicon oxide is sometimes carried out by using TEOS because of its improved handling qualities as compared to silane. TEOS is a liquid at room temperature and standard pressure. Therefore, it is normally atomized in an oxygen stream before entering the process chamber.

The combined fluids are then transported into chamber 35 for mixing. Once mixed, the gas mixture enters showerhead 26 through a ceramic tube 25. Plasma is generated at the showerhead 26, and the TEOS vapor along with the oxygen and/or nitrogen result in the formation of silicon oxide on the surface of wafer 22.

The injector 28 comprises capillary tubing which, by current state of the art techniques, is difficult to manufacture. Further, if different fluid flows are required, the injector will require significant redesign. Commonly, the lower flow dopants are at the extreme range of capillary manufacturing limitations, since the low flow dopants require a small inner diameter for the capillary tubes. In the instant invention, capillary tubing is needed to supply liquid to the throat of the injector 28; however, because of the constant pressure design of the nozzle, the capillary tubing does not need to be as restrictive in its inner diameter dimensions as those of the prior art.

Atomization is typically performed by passing a fluid through a small orifice. The pressure required to achieve atomization is high. This process is improved by using a gas to break up the fluid prior to passing through the orifice. In addition, an ultrasonic enhancer or resonator may be introduced into the system, for example, a knecked hammer may be implemented within the fluid flow path such that the fluid causes the hammer to vibrate which then helps to break the fluid into smaller droplets.

As previously discussed, minor pressure fluctuations in any of the multiple liquid flow supplies will cause the dopant flow rate to fluctuate. Having the dopant flow levels much lower than the TEOS flow rates results in minor changes in the TEOS flow causing large changes in the dopant flow. Adding to this complexity is the high pressure required to drive the dopant through the capillary tubes for vaporization.

Figure 2:
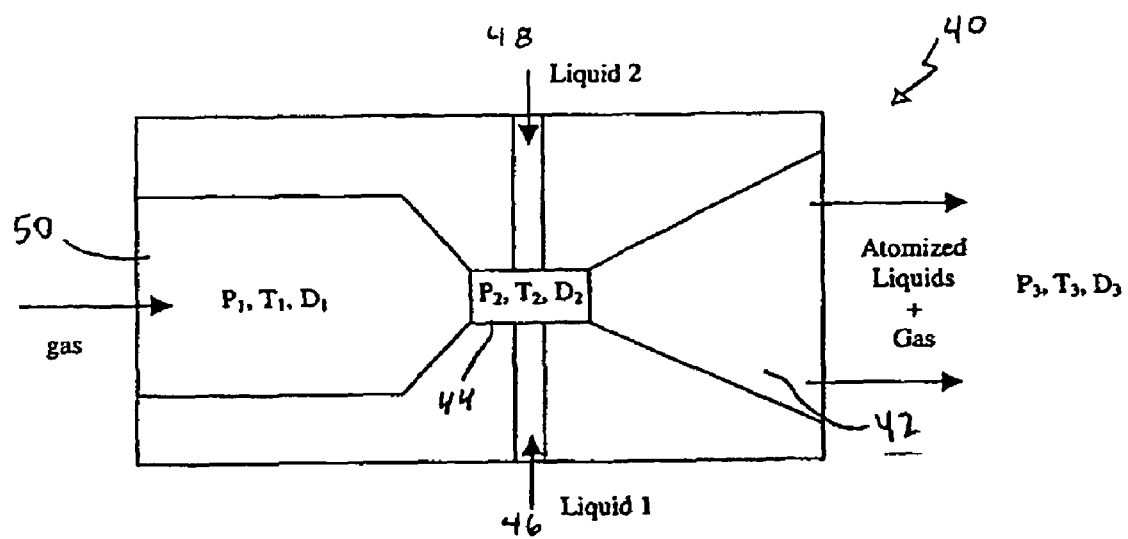
FIG. 2 is a schematic of the nozzle design for the cross-flow injector of the present invention.

A cross-flow injector has been designed to solve these issues. FIG. 2 is a schematic of the nozzle design 40 for the cross-flow injector of the present invention. It consists of an inlet nozzle 50 having a diameter $D_1$, and configured to maintain a first pressure, $P_1$, and first temperature $T_1$. This inlet nozzle 50 allows for the introduction of a carrier fluid into the system. The carrier fluid is preferably a process compatible gas, such as $O_2$, $N_2$, or He, but may be other gases known in the art and commonly used in CVD processes. The inlet nozzle 50 is tapered down to a narrower region referred to herein as throat 44 having a second diameter $D_2$, where the fluid undergoes a second pressure, $P_2$, and temperature, $T_2$. The throat 44 operates at the critical value of mach number equal to 1.0. The injector thus allows fluid mixtures to expand into the low pressure environment of the gas manifolding isentropically. The throat 44 allows for the preceding pressure, $P_1$, to be much higher than the exit pressure of the nozzle, $P_3$. At the critical point of the nozzle, throat 44, the fluids requiring atomization, which are typically introduced in liquid form, are injected. As depicted, this may include introducing more than one liquid to the throat area 44, for example, liquid 1 and liquid 2, shown introduced through inlet ports 46 and 48, respectively. These liquids can take advantage of the fact that the critical point is at a pressure, $P_2$, lower than the pressure at inlet 50, $P_1$, but at higher than the pressure at exit 42, $P_3$. This allows for the fluids to be injected into the throat 44 at an elevated and constant pressure above vacuum conditions, and below the maximum gas (fluid) pressure, $P_1$, upstream of the throat at gas inlet 50. The throat pressure, $P_2$, will remain constant as long as the gas flow is kept constant. Several injection points may be introduced, such as the two shown for liquid 1 and 2, inlets 46 and 48, respectively, so that more than one liquid may be injected simultaneously, thus allowing for the doping of films while not requiring a pre-mixing of these liquids. The liquids are introduced at a constant pressure above vacuum, $P_2$, and at the point of introduction are atomized by the fluid flow of the carrier fluid through the inlet nozzle 50. Mixing occurs in the throat and at the exit nozzle 42. At this point, a mixture of atomized liquid and gas is ready to undergo optional heat application.

Figure 3A:
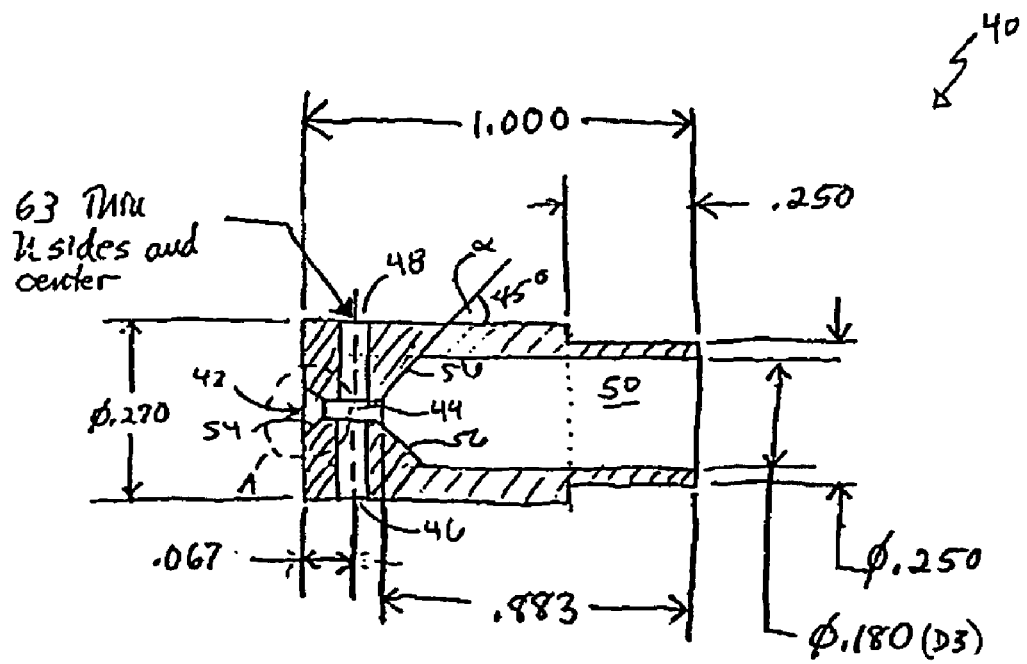
FIG. 3A is a schematic of the cross-flow injector nozzle with detailed dimensions for the inlet, throat, and exit portions.
Figure 3B:
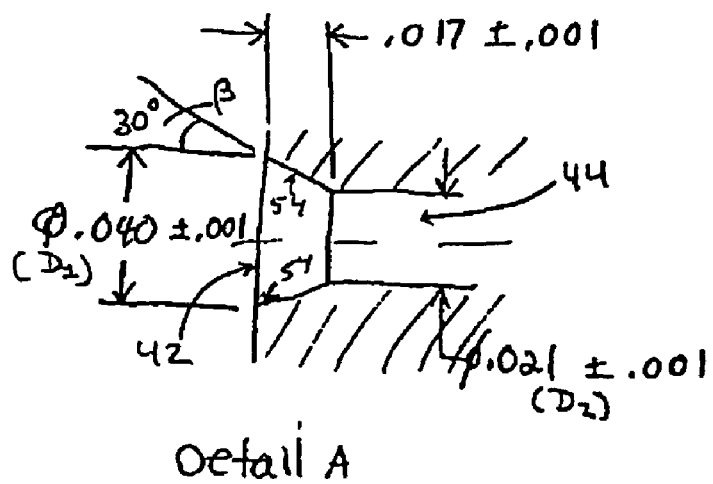
FIG. 3B is an expanded view of the dimensions of the exit nozzle of FIG. 3A.

Exit nozzle 42 is an expansion nozzle that allows for a substantial decrease in exit pressure, $P_3$, as compared to the gas inlet pressure, $P_1$. The expansion requires that the diameter of the exit portion of the nozzle, $D_3$, be significantly greater than the diameter of the throat, $D_2$. A detailed schematic of the dimensions of the cross-flow injector is depicted in FIGS. 3A and 3B. FIG. 3A shows the cross-flow injector nozzle 40 with detailed dimensions for the inlet 50, throat 44, and exit 42 portions. Importantly, the exit and inlet nozzles are depicted having expansive tapered edges, 54 and 56, respectively. Inlet edge 56 is designed at an angle a in the range of 40° to 60° with respect to the horizontal. Preferably, the inlet edge 56 is approximately 45°. Exit edge 54 is detailed in FIG. 3B, and designed to be at an angle b in the range of 20° to 40° with respect to the horizontal, and preferably approximately 30°. For the preferred embodiment, the inlet nozzle 50 is designed to have a diameter of approximately 0.180 in, tapering down at 45° to throat 44 having a diameter of approximately 0.021 in. As further depicted in FIG. 3A, the exit portion 42 expands at an angle b of 30° from the small diameter of the throat 44 to a diameter of approximately 0.040 in. Although specific dimensions are delineated as a preferred embodiment, other proportions may be employed by those skilled in the art to achieve the desired results of mixing and atomizing injected liquids in the cross-flow injector throat.

Figure 4:
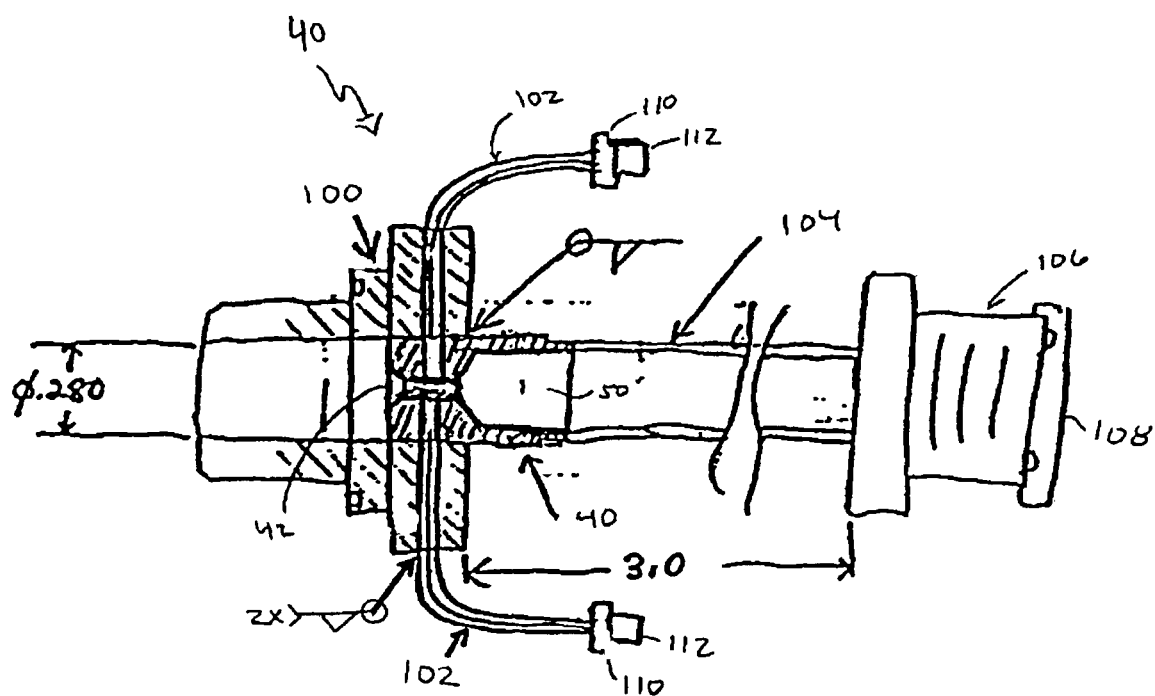
FIG. 4 is a schematic of the cross-flow injector detailing the tubing necessary for fluid transport.
Figure 5:
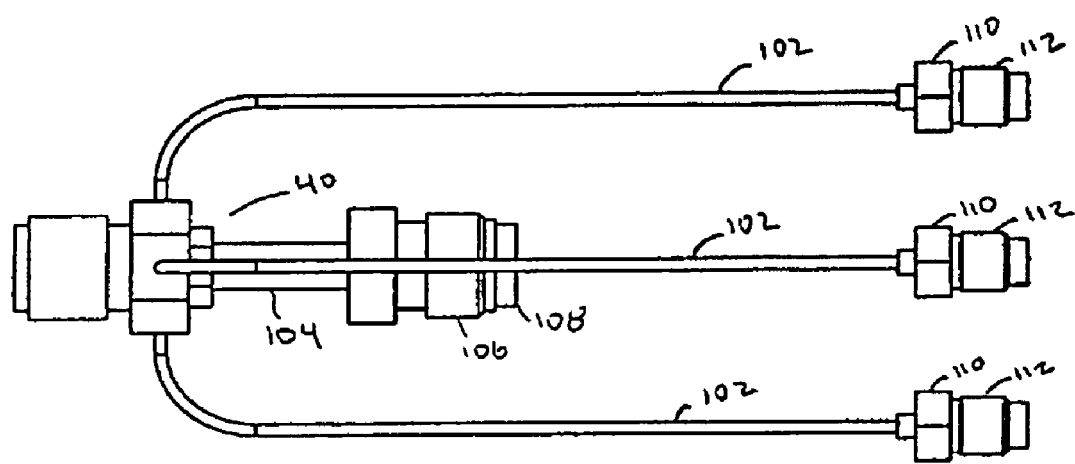
FIG. 5 is a mechanical assembly schematic of the cross-flow injector.

FIG. 4 is a schematic of a preferred embodiment of the cross-flow injector with the associated tubing necessary for fluid transport. An attachment 100 is situated on the exit nozzle 42 of the cross-flow injector 40. This is typically an SS tubing attachment having a swagelok end cut off. Tubing for liquid injection 102 is preferably on the order of 0.062 in for an outer diameter and 0.010 in for an inner diameter. The length of this injection tubing 102 varies, and is ultimately sized according to the pressure drop requirement. For these dimensions, a working test of the injection tubing 102 may entail measuring the flow rate of direct injected water to be 3.201±0.12 ml/min, with a differential pressure of 10 psia at a temperature of 70° F. Given these measurement parameters, the tubing is then varied in length to achieve the desired flow specification. After the water injection test, the injector tube is then flushed with IPA and blown completely dry with nitrogen. Tubing 104 is attached to the inlet end 50 of the injector. Preferably, this tubing is 0.25 in diameter SS tubing. A 0.25 in male mating nut 106 is attached to the end of tubing 104. This mating nut may be of the type SS-4-VCR-4 or the like. A gland 108 is configured at the end of the mating nut 106. The gland may be of the type 0.25 VCR×1.32 LG, or the like. Similarly, a mating nut 110 and gland 112 are used to terminate each injector tube 102. The mating nut 110 is preferably a 0.125 in VCR (part no. SS-2-VCR-4), while gland 112 is preferably a socket weld, 0.125 in×0.0625 VCR (part no. SS-1-VCR-3). Although SST (CAJON) materials are depicted in the preferred embodiment, it is apparent to one of skill in the art that similar material may be used in place of the above that will still achieve the same objectives and results. FIG. 5 is a mechanical assembly schematic of the cross-flow injector 40 with three injector tubes 102 attached to the injector 40 where the throat (not shown) is located within.

Figure 6:
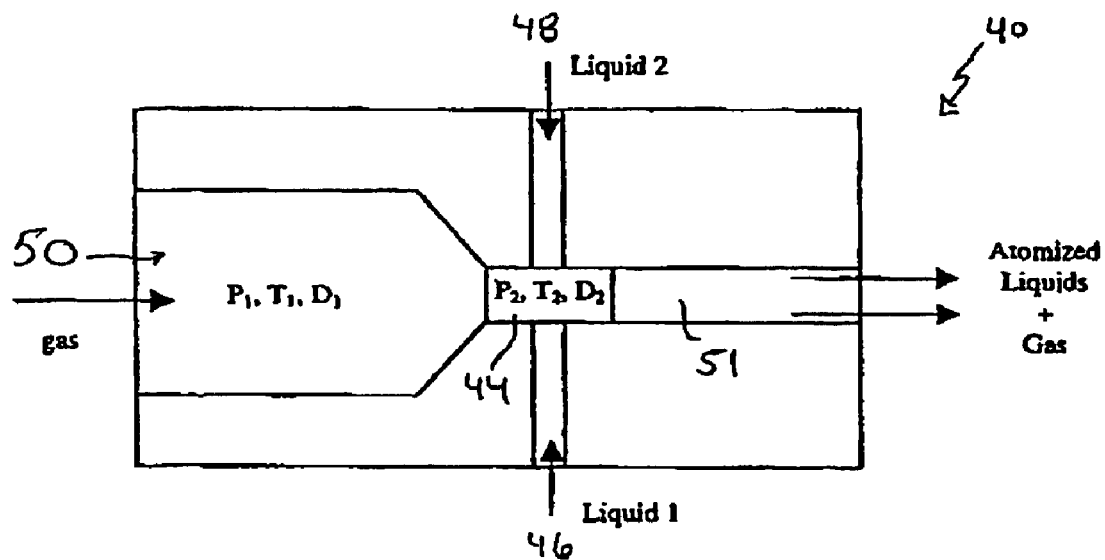
FIG. 6 is a diagram of an alternate embodiment of the cross-flow injector with the expansion nozzle on the exit end reduced to the diameter of the throat region.

FIG. 6 is a diagram of an alternate embodiment of the cross-flow injector with the expansion nozzle, i.e., exit nozzle 42, eliminated. Exit end 51 depicts the alternate design, having substantially the same diameter as that of the throat 44, $D_2$. In particular, FIG. 6 shows that in this embodiment the injector cavity includes an inlet nozzle 50 and a throat region 44. The inlet nozzle 50 is tapered to meet the smaller diameter of the throat region 44, and the throat region 44 extends to and becomes the exit nozzle portion, i.e., exit end 51, so that this exit nozzle portion maintains the same diameter as the throat region.

The governing equations for fluid (gas) flow through the cross-flow injector are the sonic flow equations. This is due to the low pressure found at each exit of the nozzle. Because of this low exit pressure, the conditions at the throat 44 will be at or near the sonic point for all operating conditions. The gas conditions at the inlet are considered to be stagnant since the throat provides enough constriction. The mass flow rate may be represented as follows:

$$dm/dt = [A_t P_1/(RT_1)^{1/2}][k\{2/(k+1)\}^{(k+1)/(k-1)}]^{1/2} \quad (1)$$

where,
$A_t$ is the throat area;
dm/dt is the mass flow rate;
R is the gas constant for the specific gas;
$T_1$ is the stagnant gas temperature; and,
k is the ratio of specific heats.

This equation is used to determine the throat diameter when the gas flow, pressure, and temperature are known parameters.

The initial pressure at the inlet, $P_1$, is related to the pressure at the throat, $P_2$, as follows:

$$P_1/P_2 = [1 + (\tfrac{1}{2})(k-1)M_a^2]^{k/(k-1)} \quad (2)$$

where,
$M_a$ is the Mach number;
$P_1$ is the stagnant pressure; and,
$P_2$ is the throat pressure.

This equation is generally used to determine the gas velocity and gas properties within the expansion nozzle.

For a Mach number equal to 1, equation (2) may be simplified to the following:

$$P_2/P_1 = [2/(k+1)]^{k/(k-1)} \quad (3)$$

Similarly, a ratio of the temperature at the throat to the temperature at the inlet may be expressed as the following:

$$T_2/T_1 = 2/(k+1) \quad (4)$$

where,
$T_1$ is the stagnant temperature; and,
$T_2$ is the throat temperature.

Equations (3) and (4) are used to express the conditions at the throat. A relationship between pressure drop and flow rate within a capillary tube can be expressed as:

$$Q = (\Delta P \pi D^4)/(128 \mu_{fluid} L) \quad (5)$$

where,
$\Delta P$ is the change in pressure;
D is the capillary diameter;
$\mu_{fluid}$ is the liquid viscosity; and,
L is the length of the capillary tubing.

In order for atomization to occur, the following condition must be met:

$$W_e << r_{gas}/r_{liquid} \quad (6)$$

where,
$r_{gas}$ is the density of the gas;
$r_{liquid}$ is the density of the liquid; and,
$W_e$ is the Webber number.

Importantly, in the present invention the capillary tubing is used only to supply liquids for the instant invention. The velocity at the throat required for atomization can be obtained from the Webber number and the surface tension of the liquid as follows:

$$W = s/(r_{liquid} V_{throat}^2 r_o) \quad (7)$$

where,
s is the surface tension of the liquid;
$V_{throat}$ is the velocity at the throat; and,
$r_o$ is the radius of the liquid flow.

In addition to the cross-flow injector, a heated manifold may be attached to facilitate and effectively atomize and vaporize any fluid (liquid) precursor prior to its introduction into the reactor chamber. Moreover, this invention allows for the introduction of various liquids with different flow rates into a constant pressure environment. For each individual application, however, safe operating regimes should be carefully examined, such as auto-ignition limits, viscosity requirements, vapor pressures, and the like. This invention is predominately used in a TEOS application, but may be valid for any liquid precursor and dopant liquids being injected into a process chamber.

APPLICATION EXAMPLE

Using the above equations and assuming a gas flow of 10,000 sccm, the following results are obtained:

TABLE 1

VARIOUS PARAMETERS AND THEIR VALUES FOR CRITICAL GAS FLOW

|  | Stagnant Conditions $P_1, T_1, D_1$ | Throat Conditions $N_2$ $P_2, T_2, D_2$ | Throat Conditions $He_2$ $P_2, T_2, D_2$ |
|---|---|---|---|
| GAS FLOW | 10,000 sccm |  |  |
| PRESSURE | 60 psia | 31.7 psia | 29.2 psia |
| TEMPERATURE | 343° K | 285.8° K | 257° K |
| THROAT DIAMETER |  | 0.039 in | 0.023 in |
| LIQUID TUBE ID | 0.010 in |  |  |
| TEOS SURFACE TENSION | 20.75 E-3 kg/s² |  |  |
| TEOS DENSITY | 936 kg/m³ |  |  |

The cross-flow injector operating under the conditions set forth in Table 1 above for helium would allow the introduction of TEOS and other dopant fluids at a relatively high pressure (29.2 psia), and would not require the use of capillary tubes to create a pressure differential. The choked, narrowed throat provides this needed pressure differential. Helium is used mainly to offset the auto-ignition concerns with TEOS. Other gases, including oxygen, could be used when explosive concerns are not present. Equation (6) is satisfied for the use of Helium since the Webber number, 1.963 E-7, is much less than the ratio of pressures, $P_2/P_1$, equal to 4.026 E-4. Thus, the TEOS will be fully atomized using the cross-flow injector.

Using the cross-flow injector requires insertion of the apparatus in-line with the liquid supply lines and the inlet port of the process chamber. Fluids are then applied separately or simultaneously to the cross-flow injector as gas is transferred to the inlet nozzle 50 of the injector 40. Measuring and monitoring equipment, commonly available to those of skill in the art, are used to regulate the flow of liquids and gas to the injector, and also to control the temperatures and pressures associated at the inlet and throat locations.

Importantly, more than one fluid may be introduced simultaneously through the cross-flow injector without pre-mixing the fluids. They can also be introduced into a constant pressure throat area which is defined by the gas flow rate and dimensions of the throat 44. Since the fluids are introduced at the throat, and the throat condition is choked flow, the throat allows for the fluid pressure to be higher than the pressure in the process chamber. This provides for the fluid to be introduced into the low pressure process chamber and become efficiently atomized, ready for heating, without concern of cavitation in the fluid supply lines.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. The combination of a chemical vapor deposition chamber and an apparatus for delivering a plurality of chemical vapor deposition fluids to said chamber, comprising:
   said chemical vapor deposition chamber for processing a semiconductor substrate;
   said apparatus for delivering said plurality of chemical vapor deposition fluids to said substrate, said apparatus attached to, and in fluid communication with, said chamber, and having a cavity comprising an inlet nozzle, a throat region and an exit nozzle,
   said inlet nozzle having a first diameter adapted to receive a carrier fluid, and having a first pressure and a first temperature;
   said throat region, having a first and second end, connected to said inlet nozzle at said first end, said throat region having a second diameter less than said first diameter and adapted to receive said carrier fluid from said inlet nozzle, said throat region having a second pressure lower than said first pressure and a second temperature, and having a first and a second aperture adjacent to said first and second ends for injecting, respectively, a first and a second chemical vapor deposition dopant into said throat region to allow for atomization of said first and second chemical vapor deposition dopants by said carrier fluid and mixing of said atomized first and second chemical vapor deposition dopants with said carrier fluid; and
   said exit nozzle, connected to said throat region at said second end, having an exit pressure lower than said second pressure and a third temperature, said exit nozzle having a third diameter greater than said second diameter to allow for a substantial decrease in pressure from said first pressure to said exit pressure, and configured to introduce said mixed atomized first and second chemical vapor deposition dopants and said carrier fluid in the chemical vapor deposition chamber.

2. The combination of claim 1 wherein said inlet nozzle having said first diameter is adapted to receive and funnel said carrier fluid to said throat region having said second diameter, said inlet nozzle narrowing at an angle in the range of forty to sixty degrees.

3. The combination of claim 1 wherein said throat region is configured to operate at a critical Mach number of 1.0.

4. The combination of claim 1 wherein said second pressure and said second temperature are selected to present a condition for atomization of said first and second chemical vapor deposition dopants.

5. The combination of claim 1 wherein said first and second chemical vapor deposition dopants comprise TEOS.

6. The combination of claim 1 wherein said throat region is configured to maintain said first pressure to be greater than said third pressure to enhance atomization of said first and second chemical vapor deposition dopants.

7. The combination of claim 1 wherein said throat region is adapted such that said second pressure is lower than said first pressure allowing for said first and second chemical vapor deposition dopants to be injected into said throat region.

8. The combination of claim 1 wherein said inlet nozzle is adapted to receive said carrier fluid at a constant flow rate ensuring said second pressure being maintained constant through said throat region.

9. The combination of claim 1 wherein said first and second chemical vapor deposition dopants are introduced simultaneously into said throat region without pre-mixing.

10. The combination of claim 1 wherein said exit nozzle expands to said third diameter from said throat region second diameter at an angle in the range of twenty to forty degrees.

11. The combination of claim 1 wherein said throat region further comprises a third aperture for injecting a third chemical vapor deposition dopant into said throat region to allow for atomization of said third chemical vapor deposition dopant by said carrier fluid, and allow for mixing of said atomized first, second and third chemical vapor deposition dopants with said carrier fluid.

12. The combination of a chemical vapor deposition chamber and an apparatus for delivering a plurality of chemical vapor deposition fluids to said chemical vapor deposition chamber, comprising:
   said chemical vapor deposition chamber for processing a semiconductor substrate; and
   said apparatus for delivering said plurality of chemical vapor deposition fluids to said substrate, said apparatus attached to, and in fluid communication with, said chamber, and having a cavity comprising an inlet nozzle, a throat region and an exit nozzle,
   said inlet nozzle having a first diameter adapted to receive a carrier fluid, and having a first pressure and a first temperature, said carrier fluid comprising a process compatible gas selected from the group consisting of $O_2$, $N_2$, and He;
   said throat region, having a first and second end, connected to said inlet nozzle at said first end, said throat region having a second diameter less than said first diameter, and adapted to receive said carrier fluid from said inlet nozzle, said throat region having a second pressure and a second temperature and having a first and a second aperture adjacent to said first and second ends for injecting, respectively, a first and a second chemical vapor deposition fluid into said throat region to allow for atomization of said first and second chemical vapor deposition fluid by said carrier fluid and mixing of said atomized first and second chemical vapor deposition fluid with said carrier fluid, said first and second chemical vapor deposition fluids comprise fluids selected from the group consisting of precursors and dopants; and,
   said exit nozzle, connected to said throat region at said second end, having said second diameter, said exit nozzle configured to maintain said second pressure and said second temperature, such that said exit nozzle is an extension of said throat region consisting of the same dimensions as said throat region, said exit region configured to introduce said atomized first and second chemical vapor deposition fluid and said carrier fluid in said chemical vapor deposition chamber.

13. The combination of claim 12 wherein said inlet nozzle having said first diameter is adapted to receive and funnel said carrier fluid to said throat region having said second diameter, said inlet nozzle narrowing at an angle in the range of forty to sixty degrees.

14. The combination of claim 12 wherein said throat region is configured to operate at a critical Mach number of 1.0.

15. The combination of claim 12 wherein said second pressure and said second temperature are selected to present a condition for atomization of said first and second chemical vapor deposition fluid.

16. The combination of claim 12 wherein said first and second chemical vapor deposition fluids comprise TEOS.

17. The combination of claim 12 wherein said throat region, having said second diameter, is adapted such that said second pressure is lower than said first pressure allowing for said first and second chemical vapor deposition fluid to be injected into said throat region.

18. The combination of claim 12 wherein said inlet nozzle is adapted to receive said carrier fluid at a constant flow rate ensuring said second pressure being maintained constant through said throat region.

19. The combination of claim 12 wherein said first and second chemical vapor deposition fluids are introduced simultaneously into said throat region without pre-mixing.

20. The combination of claim 12 wherein said throat region further comprises a third aperture for injecting a third chemical vapor deposition fluid into said throat region to allow for atomization of said third chemical vapor deposition fluid by said carrier fluid, and allow for mixing of said atomized first, second and third chemical vapor deposition fluids with said carrier fluid.

21. The combination of a chemical vapor deposition chamber and an apparatus for delivering a plurality of chemical vapor deposition fluids to said chamber, comprising:

said chemical vapor deposition chamber for processing a semiconductor substrate; and said apparatus for delivering said plurality of chemical vapor deposition fluids to said substrate, said apparatus attached to, and in fluid communication with, said chamber, having a cavity comprising a cross-flow injector, said cross-flow injector comprising an inlet nozzle, a throat region and an exit nozzle;

said inlet nozzle having a first diameter adapted to receive a carrier fluid, and having a first pressure and a first temperature, said carrier fluid comprising a process compatible gas selected from the group consisting of $O_2$, $N_2$, and He;

said throat region, having a first and second end, connected to said inlet nozzle at said first end, said throat region having a second diameter less than said first diameter, and adapted to receive said carrier fluid from said inlet nozzle, said throat region having a second pressure and a second temperature and having a first and a second aperture adjacent to said first and second ends for injecting, respectively, a first and a second chemical vapor deposition dopants into said throat region to allow for atomization of said first and second chemical vapor deposition dopants by said carrier fluid and mixing of said atomized first and second chemical vapor deposition dopants with said carrier fluid; and, said exit nozzle, having an exit pressure, connected to said throat region at said second end for receiving said atomized first and second chemical vapor deposition dopants and said carrier fluid; and wherein said chemical vapor deposition chamber is adapted to receive said mixture of atomized first and second chemical vapor deposition dopants with said carrier fluid from said exit nozzle of said cavity.

22. The combination of claim 21 wherein said exit nozzle has an exit pressure lower than said second pressure and a third temperature, said exit nozzle having a third diameter greater than said second diameter to allow for a substantial decrease in pressure from said first pressure to said exit pressure, and configured to introduce said atomized first and second chemical vapor deposition dopants and said carrier fluid in the chemical vapor deposition chamber.

23. The combination of claim 21 wherein said exit nozzle has said second pressure and said second temperature, such that said exit nozzle is an extension of said throat region consisting of the same dimensions as said throat region, said exit region being configured to introduce said atomized first and second chemical vapor deposition dopants and said carrier fluid in said chemical vapor deposition chamber.

24. The combination of a chemical vapor deposition chamber and an apparatus for delivering a plurality of chemical vapor deposition fluids to said chamber, comprising:

said chemical vapor deposition chamber for processing semiconductor substrates;

said apparatus for introducing TEOS and other dopant fluids at a high pressure, while not requiring the use of capillary tubes to create a pressure differential, said apparatus attached to, and in fluid communication with, said chamber, and having a cavity comprising an inlet nozzle, a throat region and an exit nozzle, said inlet nozzle having a first diameter adapted to receive a carrier fluid, and having a first pressure and a first temperature;

said throat region, having a first and second end, connected to said inlet nozzle at said first end, said throat region having a second diameter less than said first diameter and adapted to receive said carrier fluid from said inlet nozzle, said throat region having a second pressure lower than said first pressure and a second temperature, and having a first and a second aperture adjacent to said first and second ends for injecting, respectively, a first and a second chemical vapor deposition dopant into said throat region to allow for atomization of said first and second chemical vapor deposition dopants by said carrier fluid and mixing of said atomized first and second chemical vapor deposition dopants with said carrier fluid; and said exit nozzle, connected to said throat region at said second end, having an exit pressure lower than said second pressure and a third temperature, said exit nozzle having a third diameter greater than said second diameter to allow for a substantial decrease in pressure from said first pressure to said exit pressure, and configured to introduce said mixed atomized first and second chemical vapor deposition dopants and said carrier fluid in the chemical vapor deposition chamber.

* * * * *